US012772467B2

(12) United States Patent
Igarashi et al.

(10) Patent No.: US 12,772,467 B2
(45) Date of Patent: Oct. 20, 2026

(54) SEMICONDUCTOR DEVICE FOR SIGNAL TRANSMISSION BETWEEN DIFFERENT POTENTIALS USING INDUCTIVE COUPLING

(71) Applicant: RENESAS ELECTRONICS CORPORATION, Tokyo (JP)

(72) Inventors: Takayuki Igarashi, Tokyo (JP); Yasutaka Nakashiba, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 498 days.

(21) Appl. No.: 18/358,381

(22) Filed: Jul. 25, 2023

(65) Prior Publication Data

US 2024/0105761 A1 Mar. 28, 2024

(30) Foreign Application Priority Data

Sep. 27, 2022 (JP) ................................ 2022-154240

(51) Int. Cl.

| | |
|---|---|
| ***H01F 27/28*** | (2006.01) |
| ***H01F 17/00*** | (2006.01) |
| ***H04B 5/48*** | (2024.01) |
| ***H10D 1/20*** | (2025.01) |
| ***H10W 20/40*** | (2026.01) |
| ***H10W 44/00*** | (2026.01) |

(52) U.S. Cl.

CPC ........... *H10D 1/20* (2025.01); *H01F 17/0006* (2013.01); *H01F 27/2828* (2013.01); *H04B 5/48* (2024.01); *H10W 20/497* (2026.01); *H10W 44/501* (2026.01); *H01F 2017/0073* (2013.01); *H01F 2017/0086* (2013.01)

(58) Field of Classification Search

CPC ....... H01F 2019/085; H01F 2027/2809; H01F 27/2804

See application file for complete search history.

(56) References Cited

U.S. PATENT DOCUMENTS

2008/0230820 A1* 9/2008 Maeda ................ H10D 84/212 257/E29.345
2015/0318245 A1* 11/2015 Uchida ................ H01L 23/645 257/531
2020/0203058 A1* 6/2020 Osada ................ H01L 23/5227

FOREIGN PATENT DOCUMENTS

JP 2011-082212 A 4/2011
JP 2018064104 A * 4/2018

* cited by examiner

*Primary Examiner* — William B Partridge
*Assistant Examiner* — Felix B Andrews
(74) *Attorney, Agent, or Firm* — Rimon P.C.

(57) ABSTRACT

A semiconductor chip includes a transformer that performs contactless communication between different potentials. The semiconductor chip includes a semiconductor substrate, a semiconductor region formed in an upper surface of the semiconductor substrate, and the transformer formed over the semiconductor substrate. Here, the transformer includes a lower inductor, a lead wiring portion electrically connected to the lower inductor, and an upper inductor 100 magnetically coupled to the lower inductor, and the lead wiring portion has a wiring facing the semiconductor region.

14 Claims, 13 Drawing Sheets

SEMICONDUCTOR DEVICE FOR SIGNAL TRANSMISSION BETWEEN DIFFERENT POTENTIALS USING INDUCTIVE COUPLING

CROSS-REFERENCE TO RELATED APPLICATIONS

The disclosure of Japanese Patent Application No. 2022-154240 filed on Sep. 27, 2022, including the specification, drawings and abstract is incorporated herein by reference in its entirety.

BACKGROUND

The present disclosure relates to a semiconductor device and, more particularly, to a technique applicable to a semiconductor device capable of transmitting signals between different potentials using a pair of inductors coupled inductively.

There is a disclosed technique listed below.

[Patent Document 1] Japanese Unexamined Patent Application Publication No. 2011-82212

Patent Document 1 discloses a technique capable of increasing cross-sectional areas of coils without preventing miniaturization in order to reduce a series resistance which occupies most of the parasitic resistance components of the coils configuring the transformer.

SUMMARY

For example, a transformer (digital isolator) that enables contactless signal transmission using a pair of inductors coupled inductively is known. Since this transformer allows signal transmission in a contactless state, the electrical noise from one circuit can be suppressed from adversely affecting the other circuit. Thus, the use of the semiconductor device including the transformer can improve a signal transmission quality.

In this regard, the semiconductor device including the transformer uses a bonding wire to electrically connect the circuit and the transformer. Therefore, the parasitic inductance present in the bonding wire generates high-frequency noise, and this high-frequency noise may deteriorate the signal transmission quality. Therefore, in the semiconductor device including the transformer, there is room for improvement from the viewpoint of improving the signal transmission quality. In other words, in the semiconductor device including the transformer, suppressing the deterioration of signal transmission quality caused by the parasitic inductance of the bonding wire is desired.

In one embodiment, a semiconductor device includes a transformer that performs contactless communication between different potentials. The semiconductor device includes a semiconductor substrate of a first conductivity type, a first semiconductor region of the first conductivity type formed in an upper surface of the semiconductor substrate, and a transformer formed over the semiconductor substrate. Here, the transformer includes a lower inductor, a lead wiring portion electrically connected to the lower inductor, and an upper inductor magnetically coupled to the lower inductor. The lead wiring portion has a first wiring facing the first semiconductor region.

In one embodiment, a semiconductor device includes a first chip in which a first circuit applied with a first potential is formed, a second chip in which a second circuit applied with a second potential is formed, a third chip in which a transformer that performs contactless communication between different potentials is formed, a first bonding wire electrically connecting the first chip and the third chip, and a second bonding wire electrically connecting the second chip and the third chip. The third chip includes a semiconductor substrate of a first conductivity type, a first semiconductor region of the first conductivity type formed in an upper surface of the semiconductor substrate, and a transformer formed over the semiconductor substrate. In this case, the transformer includes a lower inductor, a lead wiring portion electrically connected to the lower inductor, and an upper inductor magnetically coupled to the lower inductor. The lead wiring portion includes a first wiring facing the first semiconductor region.

According to one embodiment, the performance of semiconductor device can be improved.

DETAILED DESCRIPTION

Figure 1:
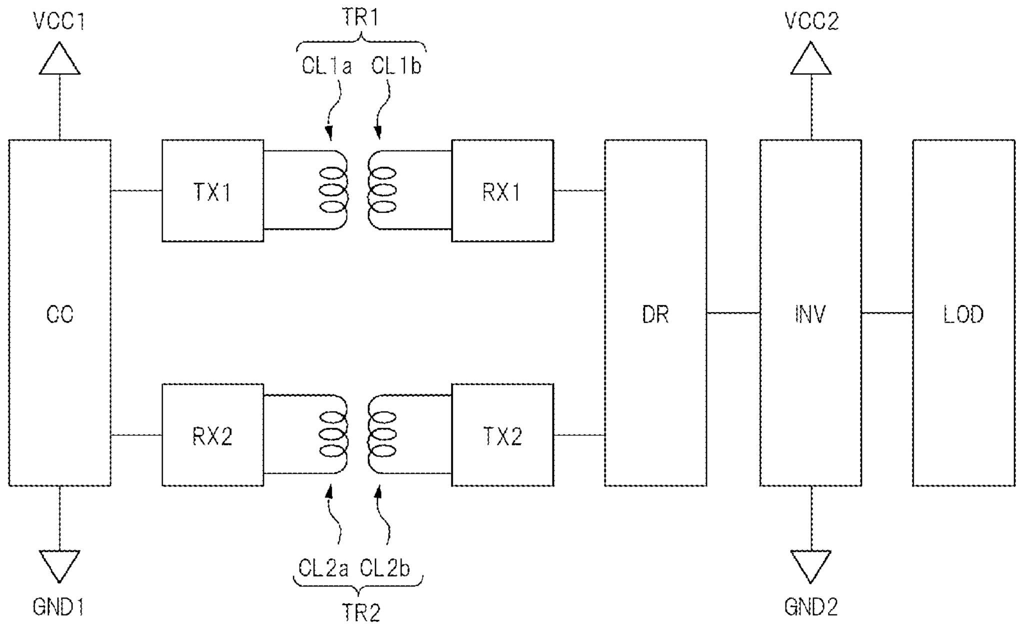
FIG. 1 is a diagram showing a configuration example of a drive control unit that drives a load circuit.

In all the drawings for explaining the embodiments, the same members are denoted by the same reference numerals in principle, and repetitive descriptions thereof are omitted. Note that even plan view may be hatched for the sake of clarity.

Circuit Configuration

FIG. 1 is a diagram showing a configuration example of a drive control unit that drives the load circuit such as a motor.

As shown in FIG. 1, the drive control unit includes the control circuit CC, the transformer TR1, the transformer TR2, the drive circuit DR, and the inverter INV, and is electrically connected to the load circuit LOD.

The transmitting circuit TX1 and the receiving circuit RX1 transmits a control signal outputted from the control circuit CC to the drive circuit DR. On the other hand, the transmitting circuit TX2 and the receiving circuit RX2 transmits a signal outputted from the drive circuit DR to the control circuit CC. The control circuit CC has a function of controlling the drive circuit DR. The drive circuit DR operates the inverter INV that controls the load circuit LOD, based on control from the control circuit CC.

The control circuit CC is supplied with the power supply potential VCC1, and the control circuit CC is grounded by the ground potential GND1. On the other hand, the inverter INV is supplied with the power supply potential VCC2, and the inverter INV is grounded by the ground potential GND2. In this case, for example, the power supply potential VCC1 is smaller than the power supply potential VCC2 supplied to the inverter INV. In other words, the power supply potential VCC2 supplied to the inverter INV is greater than the power supply potential VCC1.

The transformer TR1 formed of the coil CL1*a* and the coil CL1*b* inductively (magnetically) coupled to each other is interposed between the transmitting circuit TX1 and the receiving circuit RX1. Thus, a signal can be transmitted from the transmitting circuit TX1 to the receiving circuit RX1 via the transformer TR1. Consequently, the drive circuit DR can receive the control signal outputted from the control circuit CC via the transformer TR1.

As described above, the transformer TR1 electrically isolated using the inductive coupling enables transmitting the control signal from the control circuit CC to the drive circuit DR while suppressing the transfer of the electric noise from the control circuit CC to the drive circuit DR. Therefore, a malfunction of the drive circuit DR caused by the superimposition of the electric noise on the control signal can be suppresses. Thus, the operation reliability of the semiconductor device can be improved.

The coil CL1*a* and the coil CL1*b* configuring the transformer TR1 each function as an inductor. The transformer TR1 function as a magnetically coupled element formed of the coil CL1*a* and the coil CL1*b* inductively coupled to each other.

Similarly, the transformer TR2 formed of the coil CL2*b* and the coil CL2*a* inductively coupled to each other is interposed between the transmitting circuit TX2 and the receiving circuit RX2. Thus, a signal can be transmitted from the transmitting circuit TX2 to the receiving circuit RX2 via the transformer TR2. Consequently, the control circuit CC can receive the signal outputted from the drive circuit DR via the transformer TR2.

As described above, the transformer TR2 electrically isolated using the inductive coupling enables transmitting the signal from the drive circuit DR to the control circuit CC while suppressing the transfer of the electric noise from the drive circuit DR to the control circuit CC. Therefore, a malfunction of the control circuit CC caused by the superimposition of the electric noise on the signal can be suppresses. Thus, the operation reliability of the semiconductor device can be improved.

The transformer TR1 is configured by the coil CL1*a* and the coil CL1*b*, and the coil CL1*a* and the coil CL1*b* are not connected by conductors but are magnetically coupled. Therefore, when a current flows in the coil CL1*a*, an induced electromotive force is generated in the coil CL1*b* in accordance with a change in the current, so that an induced current flows in the coil CL1*b*. In this case, the coil CL1*a* is a primary coil, and the coil CL1*b* is a secondary coil. As described above, the transformer TR1 utilizes the electromagnetic induction phenomenon occurring between the coil CL1*a* and the coil CL1*b*. That is, as a result of transmitting a signal from the transmitting circuit TX1 to the coil CL1*a* of the transformer TR1 to flow a current, the receiving circuit RX1 detects an induced current generated in the coil CL1*b* of the transformer TR1, so that the receiving circuit RX1 can receive a signal corresponding to the control signal outputted from the transmitting circuit TX1.

Similarly, the transformer TR2 is configured by the coil CL2*a* and the coil CL2*b*, and the coil CL2*a* and the coil CL2*b* are not connected by conductors but are magnetically coupled. Therefore, when a current flows in the coil CL2*b*, an induced electromotive force is generated in the coil CL2*a* in accordance with a change in the current, so that an induced current flows in the coil CL2*a*. As described above, as a result of transmitting a signal from the transmitting circuit TX2 to the coil CL2*b* of the transformer TR2 to flow a current, the receiving circuit RX2 detects an induced current generated in the coil CL2*a* of the transformer TR2, so that the receiving circuit RX2 can receive a signal corresponding to the control signal outputted from the transmitting circuit TX2.

A signal transmission is performed between the control circuit CC and the drive circuit DR using a path from the transmitting circuit TX1 to the receiving circuit RX1 via the transformer TR1 and using a path from the transmitting circuit TX2 to the receiving circuit RX2 via the transformer TR2. That is, the signal transmission can be performed between the control circuit CC and the drive circuit DR by the receiving circuit RX1 receiving the signal transmitted by the transmitting circuit TX1 and by the receiving circuit RX2 receiving the signal transmitted by the transmitting circuit TX2. As described above, the transformer TR1 is interposed in the signal transmission from the transmitting circuit TX1 to the receiving circuit RX1, and the transformer TR2 is interposed in the signal transmission from the transmitting circuit TX2 to the receiving circuit RX2. Thus, the drive circuit DR can drive the inverter INV operating the load circuit LOD in accordance with the signal transmitted from the control circuit CC.

The control circuit CC and the drive circuit DR have different reference potentials. That is, the reference potential is fixed to the ground potential GND1 in the control circuit CC, while the drive circuit DR is electrically connected to the inverter INV as shown in FIG. 1. The inverter INV includes, for example, a high-side IGBT (Insulated Gate Bipolar Transistor) and a low-side IGBT. The drive circuit DR performs the on/off control of the high-side IGBT and the on/off control of the low-side IGBT in the inverter INV resulting in that the inverter INV can control the load circuit LOD. Specifically, the drive circuit DR performs the on/off control of the high-side IGBT by controlling the potential applied to the gate electrode of the high-side IGBT. Similarly, the drive circuit DR performs the on/off control of the low-side IGBT by controlling the potential applied to the gate electrode of the low-side IGBT.

Here, for example, the on-control of the low-side IGBT is realized by applying "emitter potential (0 V)+threshold voltage (15 V)" to the gate electrode with reference to the emitter potential (0V) of the low-side IGBT connected to the ground potential GND2. On the other hand, for example, the off-control of the low-side IGBT is realized by applying an "emitter potential (0 V)" to the gate electrode with reference to the emitter potential (0 V) of the low-side IGBT connected to the ground potential GND2.

Therefore, the on/off control of the low-side IGBT is performed according to whether or not applying the threshold voltage (15 V) to the gate electrode with 0 V as a reference potential.

On the other hand, for example, the on-control of the high-side IGBT is performed by whether or not applying "reference potential+threshold voltage (15 V)" to the gate electrode with reference to the reference potential using the emitter potential of the high-side IGBT as a reference potential.

However, the emitter potential of the high-side IGBT is not fixed to the ground potential GND2 as is the emitter potential of the low-side IGBT. That is, the high-side IGBT and the low-side IGBT are connected in series between the power supply potential VCC2 and the ground potential GND2 in the inverter INV. In the inverter INV, when the high-side IGBT is set to on-state, the low-side IGBT is set to off-state, and when the high-side IGBT is set to off-state, the low-side IGBT is set to on-state. Therefore, when the high-side IGBT is set to off-state, since the low-side IGBT is set to on-state, the emitter potential of the high-side IGBT becomes the ground potential GND2 due to the low-side IGBT set to on-state.

On the other hand, when the high-side IGBT is set to on-state, since the low-side IGBT is set to off-state, the emitter potential of the high-side IGBT becomes an IGBT bus voltage. In this case, the on/off control of the high-side IGBT is performed by whether or not applying "reference potential+threshold voltage (15V)" to the gate electrode with the emitter potential of the high-side IGBT as a reference potential.

As described above, the emitter potential of the high-side IGBT varies depending on whether the high-side IGBT is set to on-state or off-state. That is, the emitter potential of the high-side IGBT varies from the ground potential GND2 (0 V) to the power supply potential VCC2 (for example, 800 V). Therefore, in order to set the high-side IGBT to on-state, the "IGBT bus voltage (800 V)+threshold voltage (15 V)" needs to be applied to the gate electrode with the emitter potential of the high-side IGBT as a reference potential. Therefore, the drive circuit DR that performs the on/off control of the high-side IGBT needs to detect the emitter potential of the high-side IGBT. Therefore, the drive circuit DR is configured to receive the emitter potential of the high-side IGBT. Consequently, the drive circuit DR receives the reference potential of 800 V, and the drive circuit DR controls the high-side IGBT to be set to on-state by applying the threshold voltage (15 V) to the gate electrode of the high-side IGBT with reference to the reference potential of 800 V. Therefore, a high potential of the order of 800 V is applied to the drive circuit DR.

As described above, the drive control unit includes the control circuit CC that handles the low potential (several tens of volts) and the drive circuit DR that handles the high potential (several hundreds of volts). Therefore, the signal transmission between the control circuit CC and the drive circuit DR requires the signal transmission between the different potential circuits.

In this regard, the signal transmission between the control circuit CC and the drive circuit DR is performed via the transformer TR1 and the transformer TR2, so that the signal can be transmitted between different potential circuits.

As described above, a large potential difference may be generated between the primary coil and the secondary coil in the transformer TR1 and the transformer TR2. Conversely, since a large potential difference may be generated, the primary coil and the secondary coil magnetically coupled to each other without being connected by a conductor are used for signal transmission. Therefore, in forming the transformer TR1, increasing the breakdown voltage between the coil CL1*a* and the coil CL1*b* as much as possible is required from the viewpoint of improving the operation reliability of the semiconductor device. Similarly, in forming the transformer TR2, increasing the breakdown voltage between the coil CL2*b* and the coil CL2*a* as much as possible is required from the viewpoint of improving the operation reliability of the semiconductor device.

Signal Transmission Example

Figure 2:
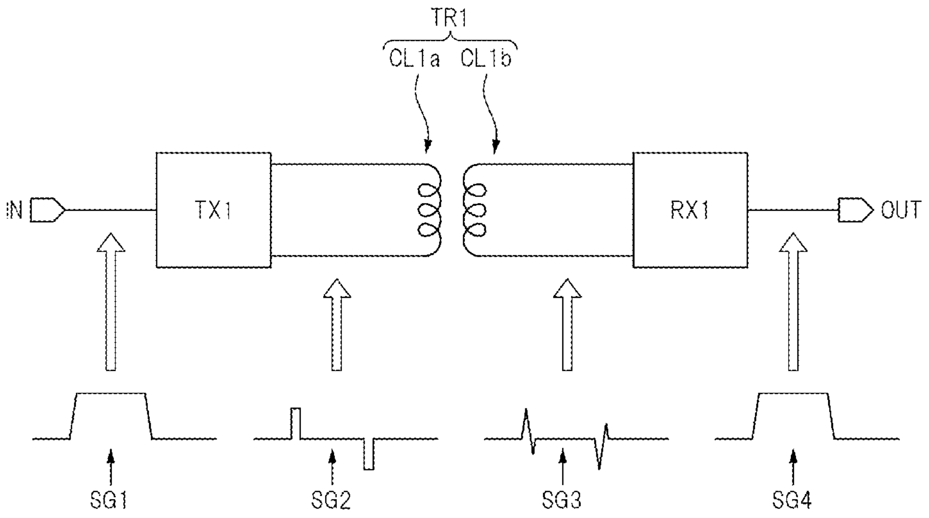
FIG. 2 is an explanatory diagram showing a signal transmission example.

FIG. 2 is an explanatory diagram showing the signal transmission example.

In FIG. 2, the transmitting circuit TX1 extracts an edge part of the signal SG1 of the square wave inputted to the transmitting circuit TX1, generates the signal SG2 having a constant pulse width, and transmits the signal SG2 to the coil CL1*a* (primary coil) of the transformer TR1. When the current caused by the signal SG2 flows to the coil CL1*a* of the transformer TR1 (primary coil), the signal SG3 flows to the coil CL1*b* (secondary coil) of the transformer TR1 by the induced electromotive force. The receiving circuit RX1 amplifies the signal SG3 and further modulates into a square wave, and then the receiving circuit RX1 outputs the signal SG4 of the square wave. Thus, the receiving circuit RX1 can output the signal SG4 corresponding to the signal SG1 inputted to the transmitting circuit TX1. In this way, the signal can be transmitted from the transmitting circuit TX1 to the receiving circuit RX1. Similarly, the signal transmission can be transmitted from the transmitting circuit TX2 to the receiving circuit RX2.

Two-Chip Configuration

Figure 3:
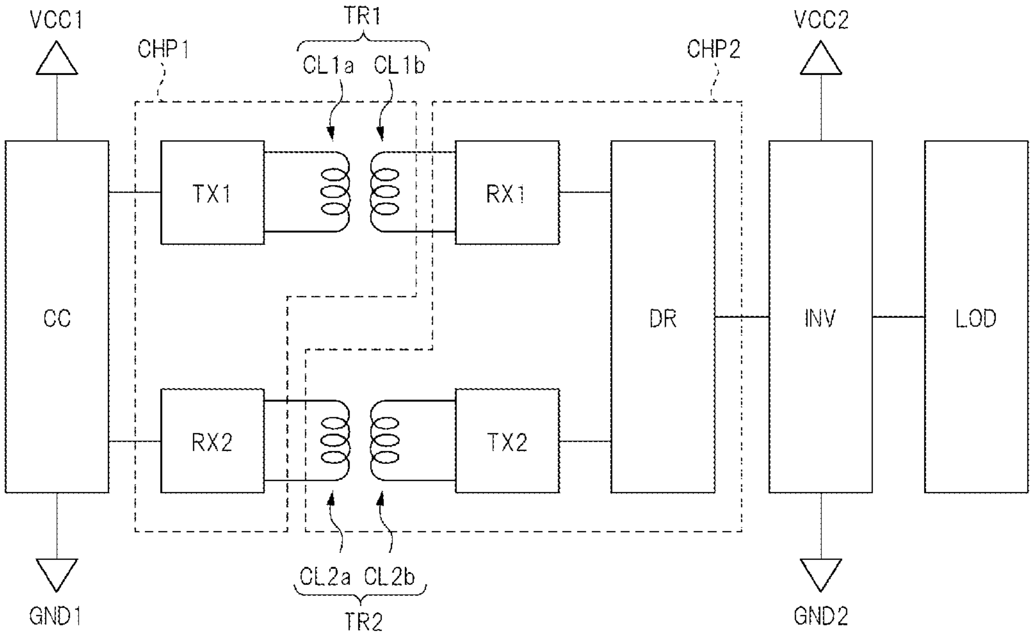
FIG. 3 is a diagram showing a two-chip configuration.

The transceiver circuit portion of the drive control unit described above, for example, is formed separately into two semiconductor chips. Specifically, FIG. 3 is a diagram showing the two-chip configuration. In FIG. 3, the transmitting circuit TX1, the transformer TR1, and the receiving circuit RX2 are formed in the semiconductor chip CHP1. On the other hand, the receiving circuit RX1, the drive circuit DR, the transmitting circuit TX2, and the transformer TR2 are formed in the semiconductor chip CHP2. In such a two-chip configuration, for example, the transformer TR1 is formed on the same semiconductor chip CHP1 as the transmitting circuit TX1 and the receiving circuit RX2. Therefore, the transformer TR1, the transmitting circuit TX1, and the receiving circuit RX2 can be integrated. Similarly, the transformer TR2 is formed on the same semiconductor chip CHP2 as the drive circuit DR, the receiving circuit RX1, and the transmitting circuit TX2. Therefore, the transformer TR2, the drive circuit DR, the receiving circuit RX1, and the transmitting circuit TX2 can be integrated.

However, in the two-chip configuration, for example, the transformer TR1, the transmitting circuit TX1, and the receiving circuit RX2 need to be formed on one semiconductor chip resulting in complicating the manufacturing process of the semiconductor chip CHP1. Similarly, in the two-chip configuration, for example, the transformer TR2, the drive circuit DR, the receiving circuit RX1, and the transmitting circuit TX2 need to be formed on one semiconductor chip resulting in complicating the manufacturing process of the semiconductor chip CHP2. The manufacturing cost of the semiconductor chip CHP1 and the semiconductor chip CHP2 is increased.

Three-Chip Configuration

Therefore, it has been studied to realize the above-described transceiver circuit unit in the three-chip configuration instead of the two-chip configuration. Hereinafter, a novel three-chip configuration will be described.

Figure 4:
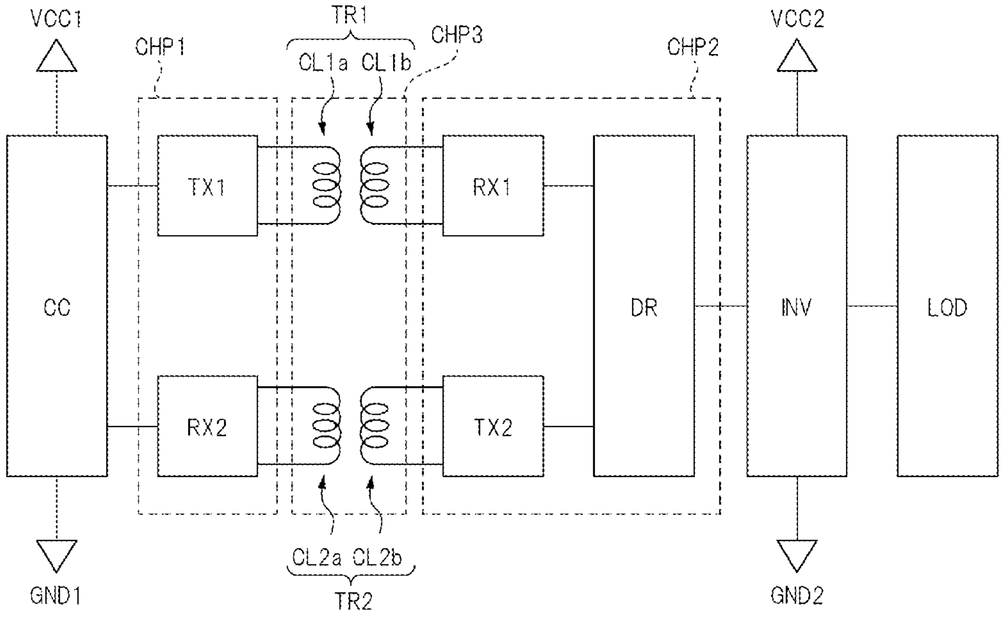
FIG. 4 is a diagram showing a three-chip configuration.

FIG. 4 is a diagram showing the three-chip configuration. In FIG. 4, the transmitting circuit TX1 and the receiving circuit RX2 are formed in the semiconductor chip CHP1. In addition, the drive circuit DR, the receiving circuit RX1, and the transmitting circuit TX2 are formed in the semiconductor chip CHP2. That is, the first circuit (the transmitting circuit TX1 and the receiving circuit RX2) configured to be applies with the first potential is formed in the semiconductor chip CHP1. In addition, the second circuit (the drive circuit DR, the receiving circuit RX1, and the transmitting circuit TX2) configured to be applies with the second potential is formed in the semiconductor chip CHP2. On the other hand, the transformer TR1 and the transformer TR2 are formed in the semiconductor chip CHP3.

Thus, in the three-chip configuration, only the transformer TR1 and the transformer TR2 are formed in the semiconductor chip CHP3. That is, in the three-chip configuration, the semiconductor chip CHP3 can be used regardless of the configuration of the semiconductor chip CHP1 and the semiconductor chip CHP2. As a result, according to the three-chip configuration, the usable variation of the semiconductor chip CHP1 and the semiconductor chip CHP2 can be increased. In other words, the versatility of the semiconductor chip CHP3 in which the transformer TR1 and the transformer TR2 are formed can be improved. Further, since the semiconductor chip CHP3 in which the transformer TR1 and the transformer TR2 are formed does not include a transistor, the semiconductor chip CHP3 can be formed only by wiring process, and thus the manufacturing process can be simplified. Therefore, the three-chip configuration can reduce the manufacturing cost, and thus a highly competitive product can be manufactured.

Consideration for Improvement

Figure 5:
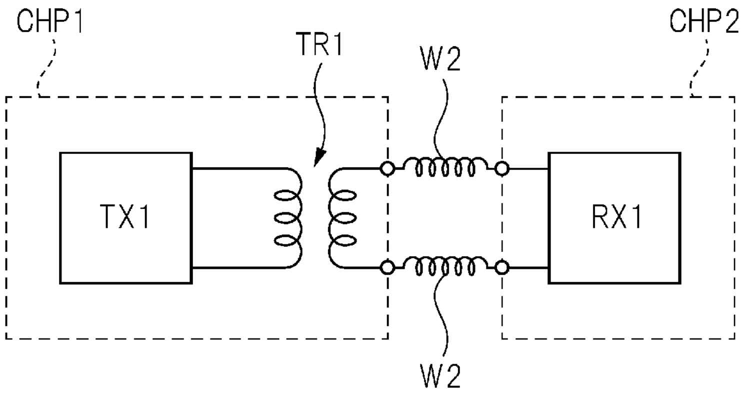
FIG. 5 is a conceptual diagram showing the semiconductor device of the “two-chip configuration”.

As described above, the "two-chip configuration" is known. In the "two-chip configuration", the transformer is mounted on either the first semiconductor chip in which one circuit is formed or the second semiconductor chip in which the other circuit is formed. FIG. 5 is a conceptual diagram showing the semiconductor device of the "two-chip configuration". In FIG. 5, the transmitting circuit TX1 and the transformer TR1 are formed in the semiconductor chip CHP1, and the receiving circuit RX1 is formed in the semiconductor chip CHP2. The semiconductor chip CHP1 and the semiconductor chip CHP2 are electrically connected by the bonding wire W2. That is, the receiving circuit RX1 and the transformer TR1 are electrically connected by the bonding wire W2, and the transmitting circuit TX1 and the transformer TR1 are electrically connected by wiring formed in the semiconductor chip CHP1. In this way, the semiconductor device of the "two-chip configuration" is configured.

However, in recent years, it has been studied to optimize the manufacturing process of the transformer regardless of the manufacturing process of the circuit by forming the transformer on a chip different from the chip in which the circuit is formed. This is because, by optimizing the manufacturing process of the transformer by forming the transformer in a chip independent of the circuit, the product cost of the semiconductor device can be reduced, so that a competitive product can be formed.

Figure 6:
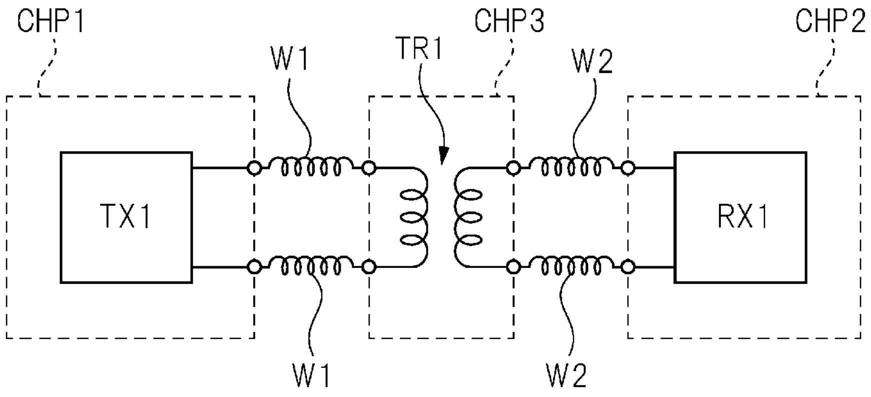
FIG. 6 is a conceptual diagram showing the semiconductor device of the “three-chip configuration”.

That is, in order to manufacture a competitive product, it has been studied to manufacture the semiconductor device of the "three-chip configuration". In the "three-chip configuration", the first semiconductor chip includes one circuit, the second semiconductor chip includes the other circuit, and the third semiconductor chip includes the transformer. FIG. 6 is a conceptual diagram showing the semiconductor device of the "three-chip configuration". In FIG. 6, the transmitting circuit TX1 is formed in the semiconductor chip CHP1, and the receiving circuit RX1 is formed in the semiconductor chip CHP2. Further, the transformer TR1 is formed in the semiconductor chip CHP3. The semiconductor chip CHP1 and the semiconductor chip CHP3 are electrically connected by the bonding wire W1, while the semiconductor chip CHP2 and the semiconductor chip CHP3 are electrically connected by the bonding wire W2. In this way, the semiconductor device of the "three-chip configuration" is configured.

As described above, in the semiconductor device of the "three-chip configuration", the semiconductor chip CHP1 and the semiconductor chip CHP3 are electrically connected by the bonding wire W1, and the semiconductor chip CHP2 and the semiconductor chip CHP3 are electrically connected by the bonding wire W2. That is, not only the receiving circuit RX1 and the transformer TR1 are electrically connected by the bonding wire W2, but also the transmitting circuit TX1 and the transformer TR1 are electrically connected by the bonding wire W1.

Therefore, in the semiconductor device of the "three-chip configuration", since the number of bonding wires is greater than that in the semiconductor device of the "two-chip configuration", the parasitic inductance of the bonding wires is increased. In other words, in the semiconductor device of the "three-chip configuration", the parasitic inductance applied to the signal transmission path is increased. Therefore, in the semiconductor device of the "three-chip configuration", the increased parasitic inductance causes increased high-frequency noises, and deterioration of signal transmission quality is concerned. That is, in the semiconductor device of the "three-chip configuration" compared to the semiconductor device of the "two-chip configuration", the effect of the parasitic inductance is increased, and consequently, the deterioration of the signal transmission quality caused by the parasitic inductance is increased.

As described above, the semiconductor device of the "three-chip configuration" can provide competitive products. However, from the viewpoint of improving the performance of the semiconductor device represented by the improvement in the signal transmission quality, consideration for improvement is required. That is, in the semiconductor device of the "three-chip configuration", improving the performance of the semiconductor device is desired by suppressing the generation of high-frequency noises caused by the increased parasitic inductances.

Therefore, in the present embodiment, a technique to overcome the room for improvement is applied to the semiconductor device of the "three-chip configuration". Hereinafter, the technical idea in the present embodiment to which the present invention is applied will be described.

Basic Concept in Embodiment

The basic idea in the present embodiment is to reduce the high-frequency noise by using the parasitic inductance, which is a factor for generating high-frequency noise. More specifically, the basic idea is to improve the signal transmission quality by suppressing the transfer of high-frequency noises in the semiconductor device including the transformer by configuring a low pass filter using parasitic inductance. This basic concept can improve the signal transmission quality since the high-frequency noise is attenuated by the low pass filter.

Figure 7:
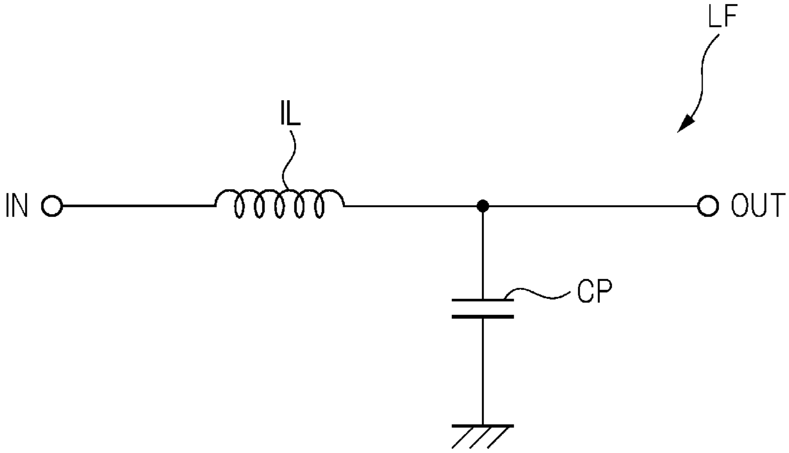
FIG. 7 is a circuit diagram showing a configuration of a low pass filter.

FIG. 7 is a schematic diagram showing a configuration of the low pass filter LF.

In FIG. 7, the low pass filter LF includes the inductor IL formed between the input terminal IN and the output terminal OUT, and the capacitance CP formed between the output terminal OUT and the ground. In the low pass filter LP configured as described above, even if the high-frequency noise is superimposed on the signal input from the input terminal IN, the high-frequency noise flows to the ground via the capacitance CP. As a consequence, the high-frequency noise included in the signal outputted from the output terminal OUT is reduced. This is because, in the capacitance CP, when the capacitance is C and the angular frequency is ω (=2πf: f is the frequency), the impedance of the capacitance CP becomes 1/ωC.

That is, the impedance of the capacitance CP becomes lower as the frequency is increased, which means that the signal and the noise are more likely to flow in the capacitance CP as the frequency is increased. Therefore, by passing through the low pass filter LP, the high-frequency noise included in the signal flows to the ground through the capacitance CP resulting in that the high-frequency noise can be reduced from the signal outputted from the low pass filter LP. In this way, by inserting the low pass filter LP into the signal transmission path, the signal transmission quality can be improved.

Figure 8:
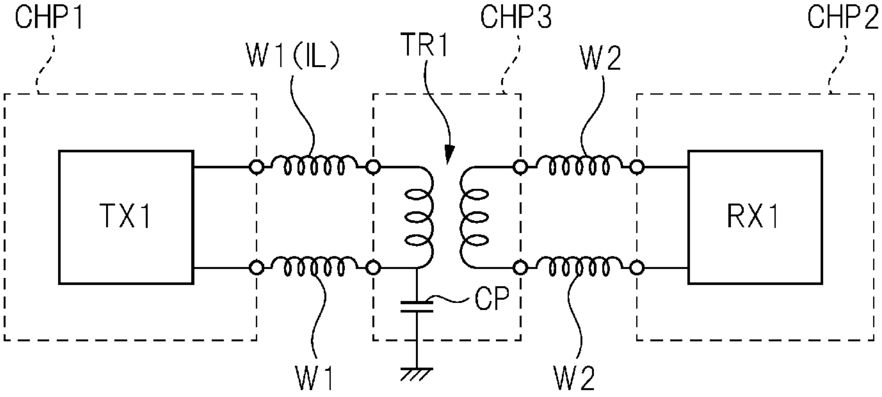
FIG. 8 is a conceptual diagram of the semiconductor device of the “three-chip configuration” including the transformer, to which a basic concept is applied.

FIG. 8 is a conceptual diagram of the semiconductor device of the "three-chip configuration" including the transformer, to which the basic concept is applied. In FIG. 8, the bonding wire W1 electrically connecting the semiconductor chip CHP3 including the transformer TR1 and the semiconductor chip CHP1 including the transmitting circuit TX1 functions as an inductor of the low pass filter LF shown in FIG. 7. On the other hand, the capacitance CP is newly formed between the transformer TR1 formed in the semiconductor chip CHP3 and the ground. This capacitance CP is shown in FIG. 7. Thus, in FIG. 8, the low pass filter can be mounted in the semiconductor chip CHP3 in which the transformer TR1 is formed, thereby realizing the basic concept.

Consequently, since the basic concept is realized in FIG. 8, in the semiconductor device of the "three-chip configuration" shown in FIG. 8, even if the bonding wire W1 having parasitic inductance that causes high-frequency noise is added, the high-frequency noise can be attenuated by the low pass filter. Thus, the semiconductor device of the "three-chip configuration" shown in FIG. 1 can improve the signal transmission quality.

In the following, a realization mode embodying the basic idea will be described.

Realization Mode

Configuration of Semiconductor Device

Figure 9:
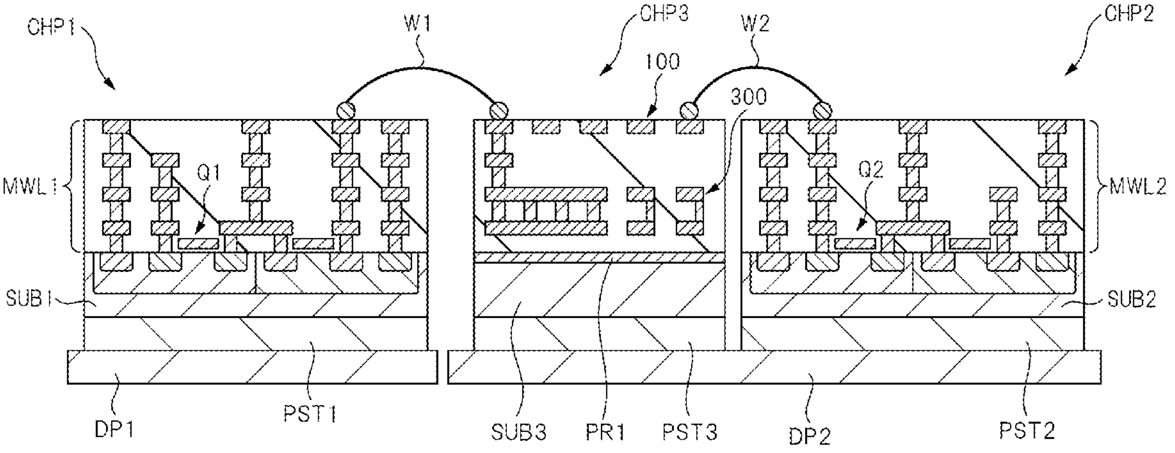
FIG. 9 is a cross-sectional view showing a schematic configuration of a semiconductor device in a realization mode.

FIG. 9 is a cross-sectional view showing a schematic configuration of the semiconductor device in the realization mode.

In FIG. 9, the semiconductor device includes the semiconductor chip CHP1, the semiconductor chip CHP2, and the semiconductor chip CHP3 including the transformer. The semiconductor chip CHP1 is mounted, for example, on the die pad DP1 that is a chip mounting portion via the conductive adhesive PST1. On the other hand, the semiconductor chip CHP2 is mounted, for example, on the die pad DP2 which is a chip mounting portion via the conductive adhesive PST2. The semiconductor chip CHP3 is mounted on the die pad DP2 via the conductive adhesive PST3.

Here, each of the die pad DP1 and the die pad DP2 is made of, for example, a copper material. Each of the conductive adhesive PST1 and the conductive adhesive PST2 is made of, for example, silver-paste or solder.

The transmitting circuit TX1 and the receiving circuit RX2 shown in FIG. 4 are formed in the semiconductor chip CHP1. As shown in FIG. 9, the semiconductor chip CHP1 includes the semiconductor substrate SUB1 and the multilayer wiring layer MWL1 formed on the semiconductor substrate SUB1. The plurality of transistors Q1 is formed on the semiconductor substrate SUB1, and the multilayer wiring layer MWL1 is formed over the semiconductor substrate SUB1 in which the plurality of transistors Q1 is formed. A wiring is formed in each layer of the multilayer wiring layer MWL1, and the wiring is electrically connected to the transistor Q1. The transistor Q1 and the wiring electrically connected to each other configure the transmitting circuit TX1 and the receiving circuit RX2. The plurality of interlayer dielectric films is laminated in the multilayer wiring layer MWL1, and is integrally shown in FIG. 9.

Next, the drive circuit DR, the receiving circuit RX1, and the transmitting circuit TX2 shown in FIG. 4 are formed in the semiconductor chip CHP2. As shown in FIG. 9, the semiconductor chip CHP2 includes the semiconductor substrate SUB2 and the multilayer wiring layer MWL2 formed on the semiconductor substrate SUB2. The plurality of transistors Q2 is formed in the semiconductor substrate SUB2, and the multilayer wiring layer MWL2 is formed over the semiconductor substrate SUB2 in which the plurality of transistors Q2 is formed. A wiring is formed in each layer of the multilayer wiring layer MWL2, and the wiring is electrically connected to the transistor Q2. The transistor Q2 and the wiring electrically connected to each other configure the drive circuit DR, the receiving circuit RX1, and the transmitting circuit TX2. The plurality of interlayer dielectric films is laminated in the multilayer wiring layer MWL2, and is integrally shown in FIG. 9.

Subsequently, as shown in FIG. 9, the transformer that performs contactless communication between different potentials is formed in the semiconductor chip CHP3. Specifically, the semiconductor chip CHP3 includes, for example, the p-type (first conductivity type) semiconductor substrate SUB3, the p-type semiconductor region PR1 formed in an upper surface of the semiconductor substrate SUB3, and the transformer formed over the semiconductor substrate SUB. In this case, the p-type semiconductor region PR1 has an impurity concentration higher than an impurity concentration of the semiconductor substrate SUB3. The transformer includes the lower inductor 300 and the upper inductor 100 disposed facing the lower inductor 300. Thus, the lower inductor 300 and the upper inductor 100 are configured to be magnetically coupled. In the semiconductor chip CHP3, the plurality of interlayer dielectric films is laminated on the semiconductor substrate SUB3, but is shown integrally in FIG. 9.

The upper inductor 100 is electrically connected to a circuit (second circuit) formed in the semiconductor chip CHP2 via the bonding wire W2. As shown in FIG. 9, the lower inductor 300 is electrically connected to a circuit (first circuit) formed in the semiconductor chip CHP1 via the bonding wire W1.

For example, in FIG. 9, the upper inductor 100 is formed of a spiral inductor, and similarly, the lower inductor 300 is formed of a spiral inductor.

The semiconductor device in the realization mode is configured as described above.

Planar Layout Configuration of Semiconductor Chip

Subsequently, the planar layout configuration of the semiconductor chip CHP3 is explained.

Figure 10:
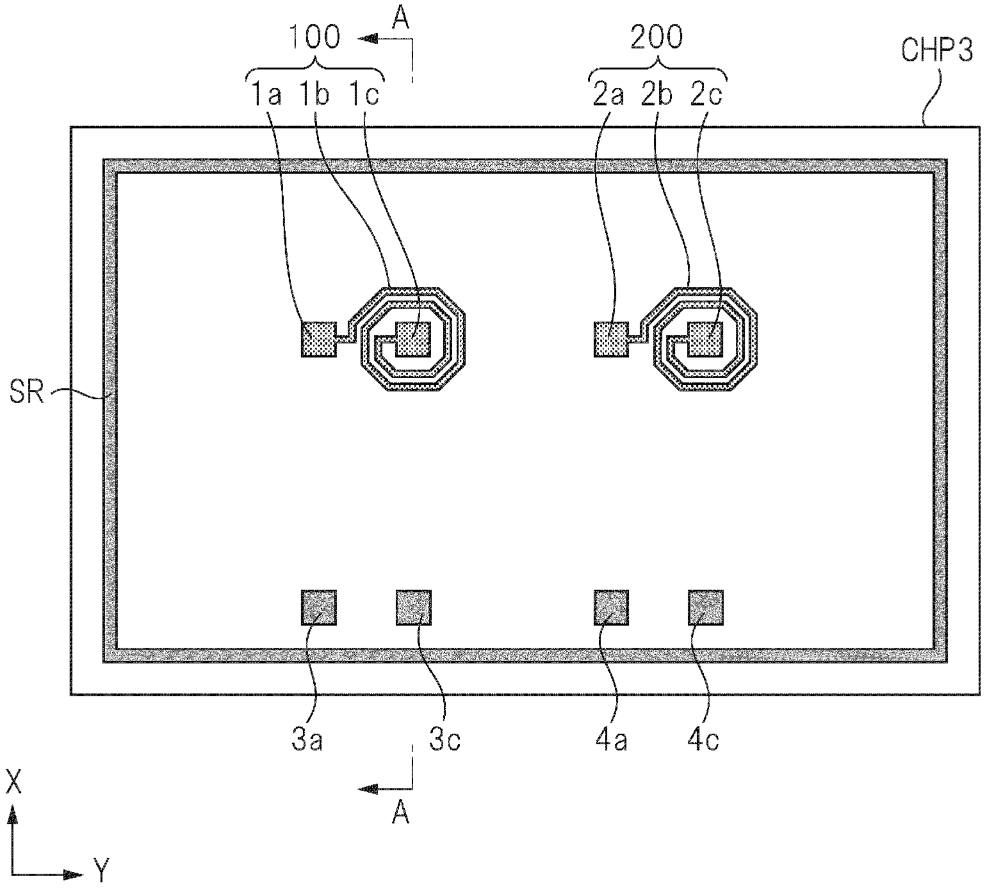
FIG. 10 is a plan view showing a planar layout of a semiconductor chip in the realization mode.

FIG. 10 is a plan view showing the planar layout configuration of the semiconductor chip CHP3.

In FIG. 10, a planar shape of the semiconductor chip CHP3 has a rectangular shape, and the sealing ring SR is formed at a peripheral edge portion of the semiconductor chip CHP3. In plan view, the upper inductor 100 and the upper inductor 200 are formed so as to be surrounded by the sealing ring SR. Here, the upper inductor 100 has the tap-pad 1*a*, the spiral wiring 1*b* connected to the tap-pad 1*a*, and the trans-pad 1*c* connected to the spiral wiring 1*b*. Similarly, the upper inductor 200 has the tap-pad 2*a*, the spiral wiring 2*b* connected to the tap-pad 2*a*, and the trans-pad 2*c* connected to the spiral wiring 2*b*.

Further, in plan view, the tap-pad 3*a* and the trans-pad 3*c*, the tap-pad 4*a*, and the trans-pad 4*c* are formed so as to be surrounded by the sealing ring SR. The tap-pad 3*a* and the trans-pad 3*c* are connected to the lower inductor (not shown) formed under the upper inductor 100. That is, the lower inductor that is paired with the upper inductor 100 is formed under the upper inductor 100, and the tap-pad 3*a* and the trans-pad 3*c* led from the lower inductor via the wiring are formed in the same layer as the upper inductor 100.

Similarly, the tap-pad 4*a* and the trans-pad 4*c* are connected to the lower inductor (not shown) formed under the upper inductor 200. That is, the lower inductor that is paired with the upper inductor 200 is formed under the upper inductor 200, and the tap-pad 4*a* and the trans-pad 4*c* led from the lower inductor via the wiring are formed in the same layer as the upper inductor 200.

Here, for example, a high-side reference potential of about 800 V is applied to the upper inductor 100 and the upper inductor 200. On the other hand, a low-side reference potential of about 0 V is applied to the lower inductor (the tap-pad 3*a* and the trans-pad 3*c*) and the lower inductor (the tap-pad 4*a* and the trans-pad 4*c*). That is, a reference potential different from the reference potential applied to the upper inductor 100 is applied to the lower inductor that is paired with the upper inductor 100. Similarly, a low-side reference potential different from the high-side reference potential applied to the upper inductor 200 is applied to the lower inductor paired with the upper inductor 200.

Cross-Sectional Structure of Semiconductor Chip

Next, the cross-sectional structure of the semiconductor chip CHP3 is explained.

Figure 11:
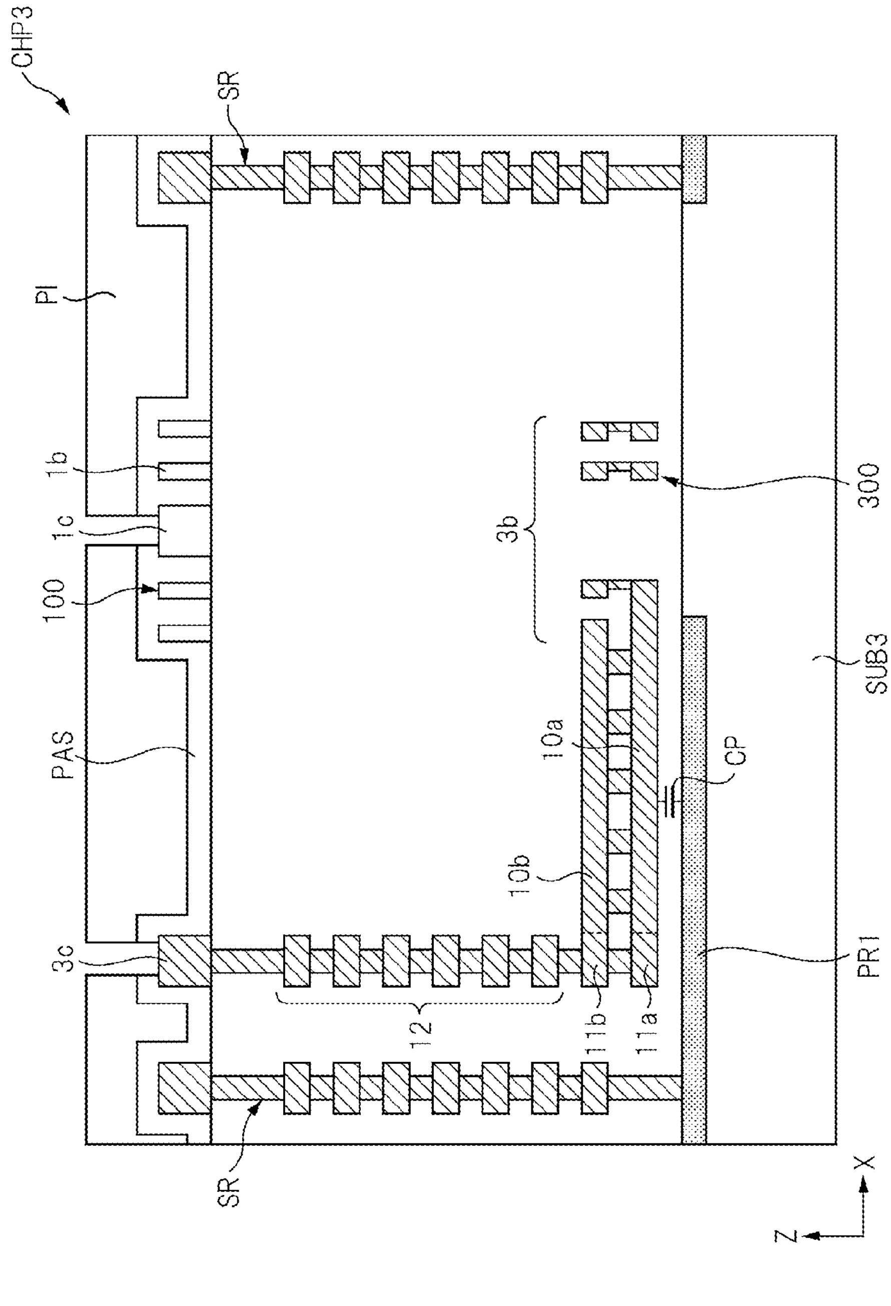
FIG. 11 is a cross-sectional view schematically showing the semiconductor chip in the realization mode, and is cross-sectional view along A-A line of FIG. 10.

FIG. 11 is a cross-sectional view of the semiconductor chip CHP3 along A-A line of FIG. 10.

In FIG. 11, the semiconductor chip CHP3 includes the semiconductor substrate SUB3. The semiconductor substrate SUB3 is made of, for example, monocrystalline silicon containing p-type impurities, and an impurity concentration of the semiconductor substrate SUB3 is, for example, $1\times10^{15}/cm^3$. The p-type semiconductor region PR1 having an impurity concentration higher than an impurity concentration of the semiconductor substrate SUB3 is formed in the upper surface of the semiconductor substrate SUB3. The p-type semiconductor region PR1 is a region in which p-type impurities are implanted into the semiconductor substrate SUB3, and an impurity concentration of the p-type semiconductor region PR1 is, for example, $1\times10^{20}$ $cm^3$. A plurality of wiring layers is formed on the p-type semiconductor region PR1. The plurality of interlayer dielectric films, the plurality of wiring, a plurality of plugs, and the seal ring SR are formed in the plurality of wiring layers. In FIG. 11, the plurality of interlayer dielectric films is not shown. In addition, the lower inductor 300 having the spiral wiring 3*b* is formed in the plurality of wiring layers. The lower inductor 300 is formed, for example, in one layer or two layers, and is electrically connected to the lead wiring portion.

The interlayer dielectric film is formed on the semiconductor substrate SUB3, and the lower inductor 300 and the lead wiring portion are formed on the interlayer dielectric film. That is, the interlayer dielectric film is disposed between the semiconductor substrate SUB3 and the lower inductor 300, between the semiconductor substrate SUB3 and the wiring 10*a*, and between the semiconductor substrate SUB3 and the lower pad 11*a*. The plurality of interlayer dielectric films and the plurality of wirings are laminated on the interlayer dielectric film, the lower inductor 300, the wiring 10*a*, and the lower pad 11*a*. The lead wiring portion includes the wiring 10*a* and the wiring 10*b*, and the wiring 10*a* and the wiring 10*b* are connected by, for example, a plug. The lead wiring portion includes the lower pad 11*a* connected to the wiring 10*a* and the lower pad 11*b* connected to the wiring 10*b*, and the lower pad 11*a* and the lower pad 11*b* are connected by the plug, for example. Further, the lead wiring portion is electrically connected to the multilayer structure 12 formed on the lower pad 11*b* and connected to the lower pad 11*b*, and electrically connected to the trans-pad 3*c* connected to the multilayer structure 12.

The multilayer structure 12 is formed of a plurality of wirings and a plurality of plugs that connect the lower pad 11*b* and the trans-pad 3*c*. Note that the lower pad 11*a* is a part of the wiring including the wiring 10*a* that overlaps with the multilayer structure 12. The lower pad 11*b* is a part of the wiring including the wiring 10*b* that overlaps with the multilayer structure 12. The wiring 10*a* and the wiring 10*b* are configured so as not to overlap with the multilayer structure 12.

That is, the lower inductor 300 is electrically connected to the trans-pad 3*c* via the lead wiring portion formed in the plurality of wiring layers. Further, the upper inductor 100 is formed on the plurality of wiring layers. That is, the upper inductor 100 is formed so as to overlap with the lower inductor 300, and the upper inductor 100 includes the spiral wiring 1*b* and the trans-pad 1*c*. The upper part of the lower inductor 300, the wiring 10*b*, and the lower pad 11*b* are formed in the same layer, and the lower part of the lower inductor 300, the wiring 10*a*, and the lower pad 11*a* are formed in the same layer.

Then, the surface protective film PAS and the polyimide resin film PI are formed so as to cover the upper inductor 100, the trans-pad 1*c*, and the trans-pad 3*c*. The surface protective film PAS and the polyimide resin film PI includes openings that expose a part of an upper surface of the trans-pad 3*c* and a part of an upper surface of the trans-pad 1*c*. The surface protective film PAS is formed of a silicon nitride film or a laminated film of a silicon oxide film and a silicon nitride film.

For example, the bonding wire W1 is electrically connected to the trans-pad 3*c* (upper pad) exposed from the opening (see FIG. 9). That is, the trans-pad 3*c*, which is an upper pad, is configured connectable to the bonding wire W1.

Here, in FIG. 11, the wiring 10*a* is disposed so as to face the p-type semiconductor region PR1, and the capacitance CP is formed by the p-type semiconductor region PR1 and the wiring 10*a* facing each other. In other words, the p-type semiconductor region PR1 is configured to include a region that overlaps with the wiring 10*a* in plan view, and the region of the p-type semiconductor region PR1 and the region of the wiring 10*a* that overlap with each other in plan view form the capacitance CP. The capacitance CP and the inductance of the bonding wire W1 connected to the trans-pad 3*c* configure the low pass filter.

Figure 12:
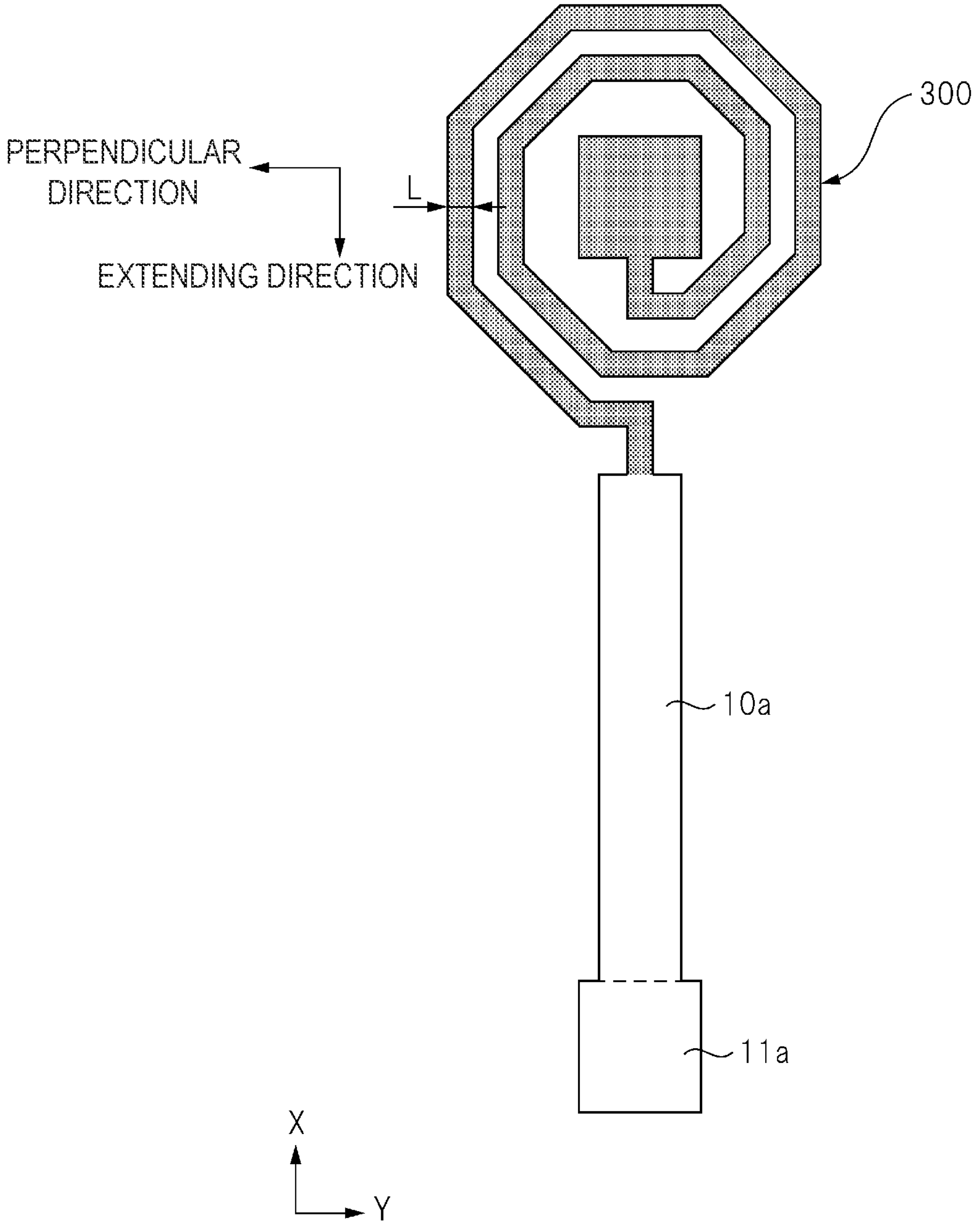
FIG. 12 is an exemplary plan view showing a lower inductor, a wiring connected to the lower inductor, and a lower pad connected to the wiring.

Subsequently, FIG. 12 is a plan view showing the lower inductor 300, the wiring 10*a* connected to the lower inductor 300, and the lower pad 11*a* connected to the wiring 10*a*. As shown in FIG. 12, the lower inductor 300 is configured by an inductor wiring having a spiral shape, and the lower inductor 300 is connected to the wiring 10*a*. The wiring 10*a* is connected to the lower pad 11*a*. Here, a width of the wiring 10*a* (the width in the Y-direction) is greater than a width L of the inductor wiring. The width L of the inductor wiring is a length of the inductor wiring in a perpendicular direction perpendicular to an extending direction of the inductor wiring. In FIG. 12, the exemplary width L of a portion of the inductor wiring extending in the extending direction shown in FIG. 12 is shown. For example, if the other part of the inductor wiring extends in the perpendicular direction shown in FIG. 12, the width L of the other part of the inductor wiring is the length of the inductor wiring in the extending direction shown in FIG. 12. For example, the width L of the inductor wiring is about 7 μm, while the width of the wiring 10*a* is about 70 μm.

The semiconductor chip CHP3 is configured as described above.

Features in Realization Mode

Next, the feature points in the realization mode will be described.

A first feature point in the realization mode is that, for example, as shown in FIG. 11, the p-type semiconductor region PR1 is formed in the upper surface of the semiconductor substrate SUB3 such that the p-type semiconductor region PR1 and the wiring 10*a* have regions facing each other. In other words, the feature point in the realization mode is that the p-type semiconductor region PR1 is formed in the upper surface of the semiconductor substrate SUB3 such that the p-type semiconductor region PR1 and the wiring 10*a* have regions overlap with each other.

Thus, according to the first feature point in the realization mode, the capacitance CP is formed by the p-type semiconductor region PR1 and the wiring 10*a* facing each other. In other words, the p-type semiconductor region PR1 is configured to include the region that overlaps with the wiring 10*a* in plan view, and the region of the p-type semiconductor region PR1 and the region of the wiring 10*a* that overlap with each other in plan view form the capacitance CP. The capacitance CP and the inductance of the bonding wire W1 connected to the trans-pad 3*c* configure the low pass filter. Consequently, according to the first feature point, in the semiconductor device of the "three-chip configuration", even if the bonding wire W1 having parasitic inductance that causes high-frequency noise is added, the low pass filter can attenuate the high-frequency noise. Thus, according to the first feature point in the realization mode, the signal transmission quality can be improved in the semiconductor device of the "three-chip configuration".

Figure 13:
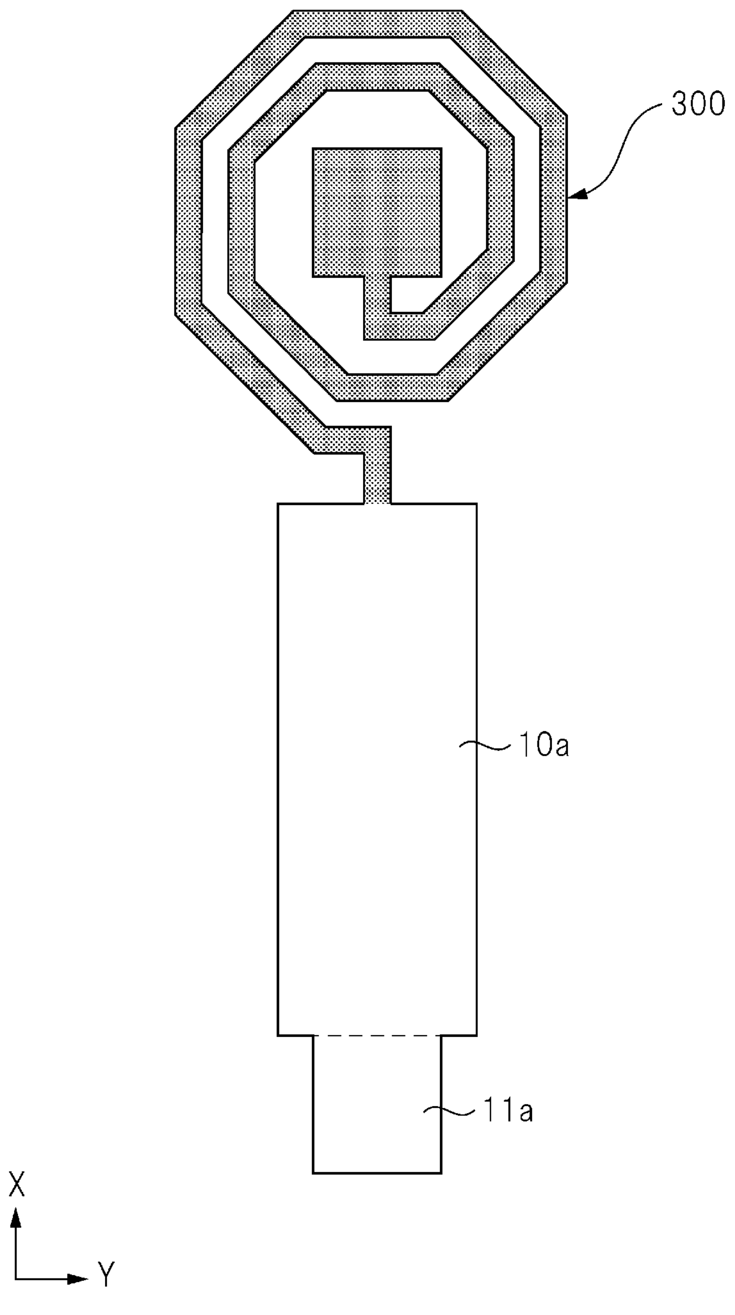
FIG. 13 is another exemplary plan view showing the lower inductor, the wiring connected to the lower inductor, and the lower pad connected to the wiring.
Figure 14:
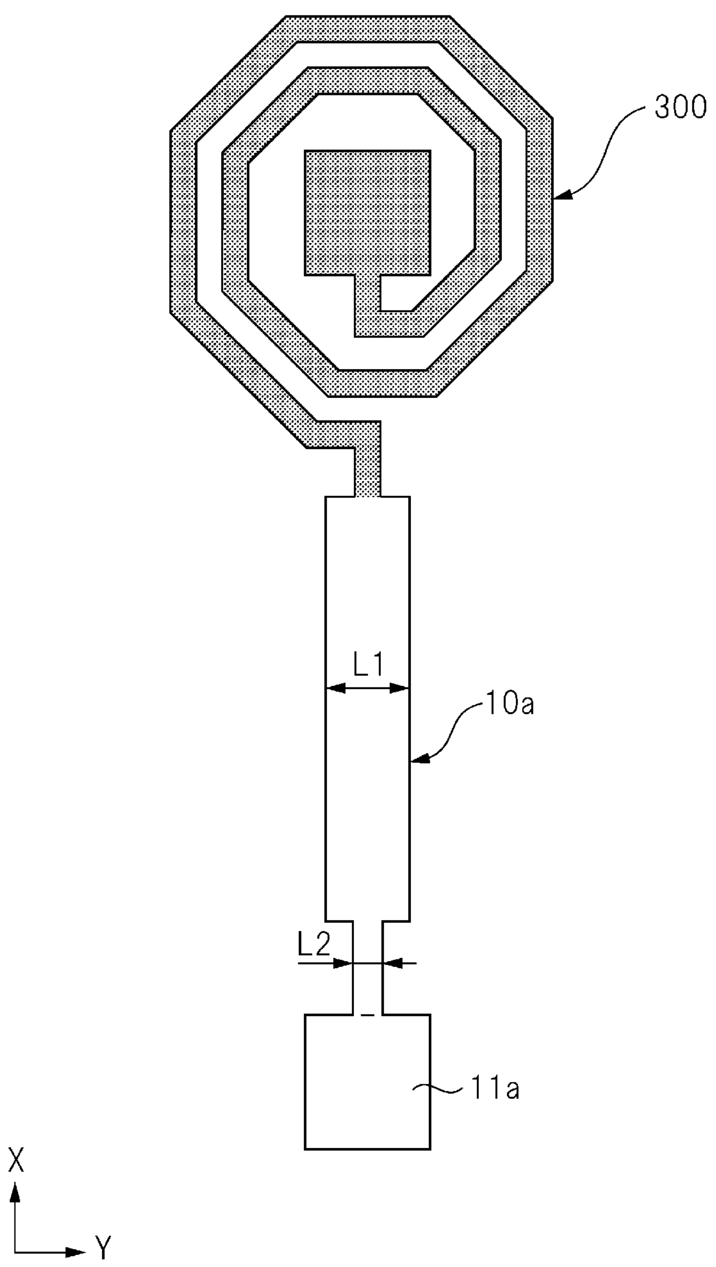
FIG. 14 is another exemplary plan view showing the lower inductor, the wiring connected to the lower inductor, and the lower pad connected to the wiring.

Subsequently, as shown in FIG. 12, a second feature point in the realization mode is that the width of the wiring 10*a* (the width in the Y-direction) is greater than the width L of the inductor wiring of the lower inductor 300. Therefore, the facing area between the wiring 10*a* and the p-type semiconductor region PR1 located under the wiring 10*a* can be improved. This means that the capacitance value of the capacitance CP formed by the p-type semiconductor region PR1 and the wiring 10*a* facing each other can be increased. Therefore, according to the second feature point in the realization mode, the capacitance value of the capacitance CP required for the low pass filter can be easily secured. Further, the cutoff frequency of the low pass filter can be adjusted by adjusting the width of the wiring 10*a*. For example, as shown in FIG. 13, the width of the wiring 10*a* (width in the Y-direction) may be greater than the width of the lower pad 11*a* (width in the Y-direction). Further, as shown in FIG. 14, the wiring 10*a* may be configured by combining a portion having the first width L1 in the Y-direction and a portion having the second width L2 smaller than the first width L1 in the Y-direction. That is, as shown in FIG. 14, the wiring 10*a* may be configured to have a portion that differs in width in the Y-direction.

Modified Example

Figure 15:
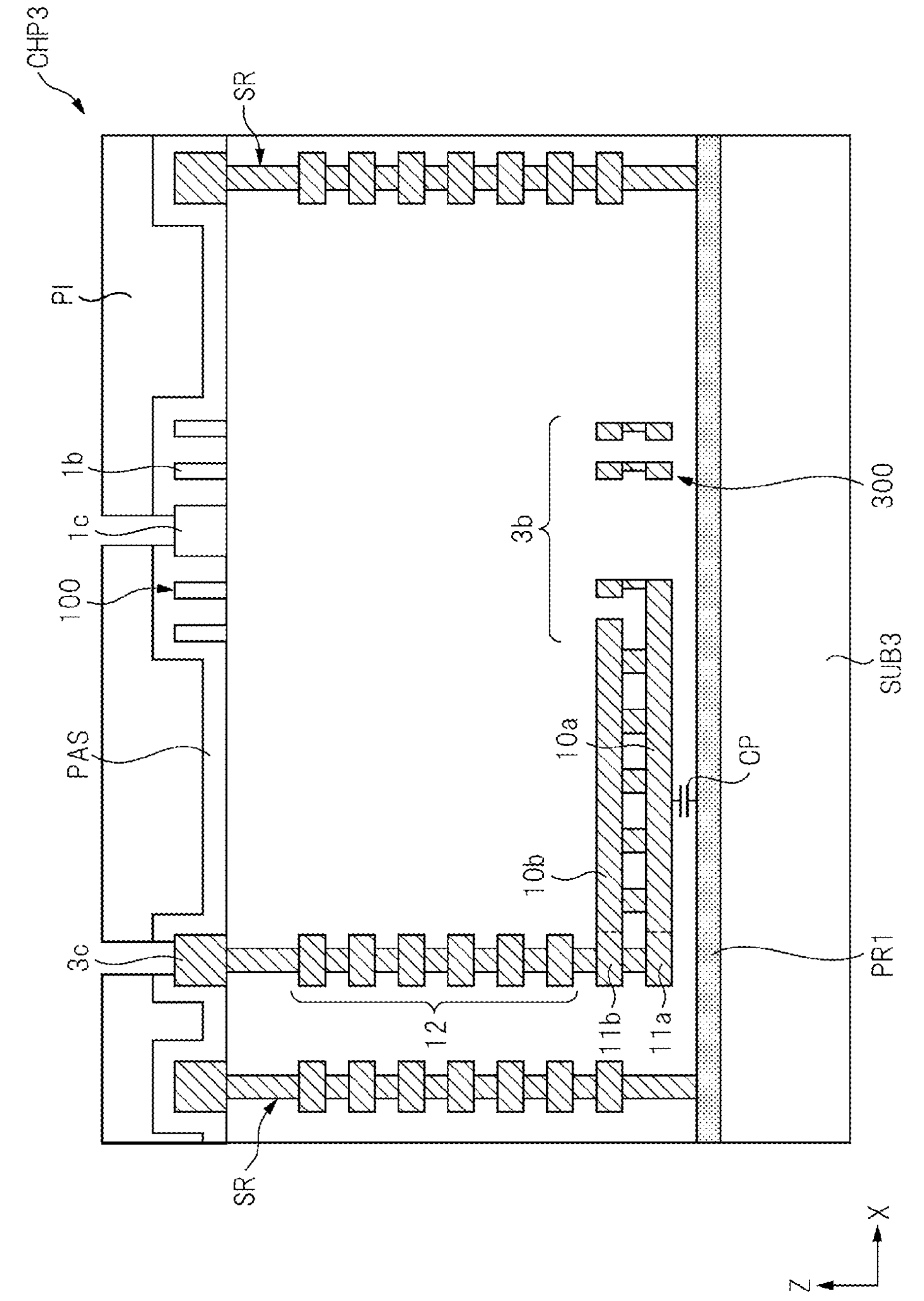
FIG. 15 is a cross-sectional view showing a modified example of the realization mode shown in FIG. 11.

For example, the p-type semiconductor region PR1 may be formed not only to have the region overlapping with the wiring 10*a* in plan view but also to overlap with the spiral wiring of the lower inductor 300 in plan view. Further, the p-type semiconductor region PR1 may be formed in the entire upper surface of the semiconductor substrate SUB3, for example, as shown in FIG. 15. In this case, a patterning step for forming the p-type semiconductor region PR1 is not required. Therefore, the configuration in which the p-type semiconductor region PR1 is formed in the entire upper surface of the semiconductor substrate SUB3 can improve the signal transmission quality of the semiconductor device while simplifying the manufacturing process of the semiconductor device.

The invention made by the present inventor has been described above in detail based on the embodiment, but the present invention is not limited to the embodiment described above, and it is needless to say that various modifications can be made without departing from the gist thereof.

What is claimed is:

1. A semiconductor device having a transformer that performs contactless communication between different potentials, comprising:
- a semiconductor substrate of a first conductivity type;
- a first semiconductor region of the first conductivity type formed in an upper surface of the semiconductor substrate; and
- the transformer formed over the semiconductor substrate,
- wherein the transformer includes:
  - a lower inductor;
  - a lead wiring portion electrically connected to the lower inductor; and
  - an upper inductor magnetically coupled to the lower inductor,
- wherein the lead wiring portion includes a first wiring facing the first semiconductor region,
- wherein a capacitance is formed by the first semiconductor region and the first wiring facing each other, and
- wherein a low pass filter is configurable by the capacitance and an inductance of a bonding wire.

2. The semiconductor device according to claim 1,
- wherein the first semiconductor region has an impurity concentration higher than an impurity concentration of the semiconductor substrate.

3. The semiconductor device according to claim 1,
- wherein the lower inductor is configured by an inductor wiring having a spiral shape, and
- wherein a width of the first wiring is greater than a width of the inductor wiring.

4. The semiconductor device according to claim 1,
- wherein the first semiconductor region includes a region overlapping with the first wiring in plan view.

5. The semiconductor device according to claim 1,
- wherein the first semiconductor region includes a region overlapping with the lower inductor in plan view.

6. The semiconductor device according to claim 1, wherein the first semiconductor region is formed in all the upper surface of the semiconductor substrate.

7. The semiconductor device according to claim 1, wherein the lead wiring portion includes:
the first wiring connected to the lower inductor;
a lower pad connected to the first wiring;
a multilayer structure connected to the lower pad; and
an upper pad connected to the multilayer structure,
wherein the lower pad is a wiring overlapping with the multilayer structure,
wherein the first wiring is configured so as not to overlap with the multilayer structure, and
wherein the upper pad is configured connectable to the bonding wire.

8. The semiconductor device according to claim 7, wherein the lower inductor, the first wiring and the lower pad are formed in the same layer, and
wherein the multilayer structure is formed on the lower pad.

9. The semiconductor device according to claim 7, comprising:
an interlayer dielectric film formed on the semiconductor substrate,
wherein the interlayer dielectric film is disposed between the semiconductor substrate and the lower inductor, between the semiconductor substrate and the first wiring, and between the semiconductor substrate and the lower pad.

10. The semiconductor device according to claim 7, comprising:
a surface protective film formed so as to cover the upper pad and the upper inductor,
wherein the surface protective film has an opening portion exposing a part of an upper surface of the upper pad.

11. The semiconductor device according to claim 7, comprising:
a first chip in which a first circuit configured to be applied with a first potential is formed;
a second chip in which a second circuit configured to be applied with a second potential is formed; and
a third chip in which the transformer is formed.

12. A semiconductor device comprising:
a first chip in which a first circuit configured to be applied with a first potential is formed;
a second chip in which a second circuit configured to be applied with a second potential is formed;
a third chip in which a transformer that performs contactless communication between different potentials is formed;
a first bonding wire electrically connecting the first chip and the third chip; and
a second bonding wire electrically connecting the second chip and the third chip,
wherein the third chip includes:
a semiconductor substrate of a first conductivity type;
a first semiconductor region of the first conductivity type formed in an upper surface of the semiconductor substrate; and
the transformer formed over the semiconductor substrate,
wherein the transformer includes:
a lower inductor;
a lead wiring portion electrically connected to the lower inductor; and
an upper inductor magnetically coupled to the lower inductor,
wherein the lead wiring portion includes a first wiring facing the first semiconductor region,
wherein the first bonding wire is configured so as to electrically connect to the first circuit and the lower inductor,
wherein a capacitance is formed by the first semiconductor region and the first wiring facing each other, and
wherein a low pass filter is configured by the capacitance and an inductance of the first bonding wire.

13. The semiconductor device according to claim 12, wherein the first semiconductor region has an impurity concentration higher than an impurity concentration of the semiconductor substrate.

14. The semiconductor device according to claim 12, wherein the lead wiring portion includes:
the first wiring connected to the lower inductor;
a lower pad connected to the first wiring;
a multilayer structure connected to the lower pad; and
an upper pad connected to the multilayer structure,
wherein the lower pad is a wiring overlapping with the multilayer structure,
wherein the first wiring is configured so as not to overlap with the multilayer structure, and
wherein the upper pad is configured connectable to a bonding wire.

* * * * *